(12) United States Patent
Levy et al.

(10) Patent No.: US 10,754,760 B1
(45) Date of Patent: Aug. 25, 2020

(54) DETECTION OF RUNTIME FAILURES IN A SYSTEM ON CHIP USING DEBUG CIRCUITRY

(71) Applicant: Xilinx, Inc., San Jose, CA (US)

(72) Inventors: Paul S. Levy, Chandler, AZ (US); Giulio Corradi, Munich (DE)

(73) Assignee: Xilinx, Inc., San Jose, CA (US)

(*) Notice: Subject to any disclaimer, the term of this patent is extended or adjusted under 35 U.S.C. 154(b) by 247 days.

(21) Appl. No.: 15/982,698

(22) Filed: May 17, 2018

(51) Int. Cl.
*G06F 11/36* (2006.01)
*G01R 31/317* (2006.01)

(52) U.S. Cl.
CPC .... *G06F 11/3656* (2013.01); *G01R 31/31705* (2013.01); *G06F 11/3636* (2013.01)

(58) Field of Classification Search
CPC .......... G01R 31/31705; G06F 11/3636; G06F 11/3656
USPC .............................. 714/30, 31, 45
See application file for complete search history.

(56) References Cited

U.S. PATENT DOCUMENTS

| | | | | |
|---|---|---|---|---|
| 7,526,422 B1* | 4/2009 | Nemecek | .............. | G06F 30/331 703/28 |
| 7,673,188 B2* | 3/2010 | Choate | ................ | G06F 11/2236 714/11 |
| 7,886,195 B2* | 2/2011 | Mayer | ................. | G06F 11/3648 714/38.1 |
| 7,890,831 B2* | 2/2011 | Choate | ............. | G01R 31/31703 714/10 |
| 2012/0066551 A1* | 3/2012 | Palus | ...................... | G06F 11/28 714/39 |

OTHER PUBLICATIONS

ARM, "ARM Debug Interface Architecture Specification ADIv5.0 to ADIv5.2," Feb. 8, 2006, pp. 1-250, ARM Holdings, Cambridge, United Kingdom.
ARM, "CoreSight Technical Introduction," ARM-EPM-039795, Aug. 2013, pp. 1-16, ARM Holdings, Cambridge, United Kingdom.
Xilinx, "Zynq UltraScale+ MPSoC," UG1085 (v1.5). Mar. 31, 2017, pp. 1-40, Xilinx, Inc., San Jose, California, USA.

* cited by examiner

*Primary Examiner* — Joseph R Kudirka
(74) *Attorney, Agent, or Firm* — Crawford Maunu PLLC

(57) ABSTRACT

Disclosed approaches involve at least one processor executing a program and a debug interface circuit coupled to the processor. The debug interface circuit is configured to transmit first trace data from the first processor. A debug access port is coupled to the debug interface circuit. A fault detection circuit is coupled to the debug access port and is configured to receive the first trace data via the debug access port and compare the first trace data to second data. The fault detection circuit generates an error signal to the first processor in response to a discrepancy between the first trace data and the second data.

11 Claims, 4 Drawing Sheets

US 10,754,760 B1

DETECTION OF RUNTIME FAILURES IN A SYSTEM ON CHIP USING DEBUG CIRCUITRY

TECHNICAL FIELD

The disclosure generally relates to safety functions.

BACKGROUND

The "functional safety" of a system relates to the system operating as expected in response to the inputs to the system. Functional safety can be important for avoiding damage to health or physical injury to people. Safety functions for monitoring equipment under control (EUC) can be implemented by electro-mechanical relays, non-programmable solid-state electronics, programmable electronics or any combination of the foregoing. The International Electrotechnical Commission (IEC) set forth standard IEC 61508 to define appropriate means for achieving functional safety.

In order to ensure functional safety, system designers take measures to protect the integrity of the safety functions themselves. Examples of approaches to protecting the safety functions include error detection and correction in SRAMs and executing the same program code in lockstep by redundant processors.

Some processor architectures may not be amenable to using lockstep execution for a safety function. For example, some processors execute instructions out-of-order and some superscalar processors include multiple execution units such as an arithmetic logic unit (ALU), an integer multiplier, integer shifter, a floating point unit (FPU), etc. Some processors may have many instances of each of the different execution units. Implementing redundant processors that execute in lockstep for complicated processors architectures can be unfeasible due to the required replication of every execution unit and voting circuits.

SUMMARY

A disclosed circuit arrangement includes at least one processor executing a program and a debug interface circuit coupled to the processor. The debug interface circuit is configured to transmit first trace data from the first processor. A debug access port is coupled to the debug interface circuit. A fault detection circuit is coupled to the debug access port and is configured to receive the first trace data via the debug access port and compare the first trace data to second data. The fault detection circuit generates an error signal to the first processor in response to a discrepancy between the first trace data and the second data.

Another circuit arrangement includes a processor subsystem and a programmable logic subsystem. The processor subsystem includes a first processor and a debug interface circuit coupled to the first processor. The debug interface circuit is configured to transmit first trace data from the first processor. The programmable logic subsystem includes programmable logic circuitry, programmable routing circuitry, and a debug access port coupled to the programmable logic circuitry, to the programmable routing circuitry, and to the debug interface circuit. The programmable logic subsystem further includes configuration memory programmed with configuration data that implement a fault detection circuit in the programmable logic circuitry and programmable routing circuitry. The fault detection circuit is configured to receive the first trace data via the debug access port and compare the first trace data to second data. The fault detection circuit generates an error signal to the first processor in response to a discrepancy between the first trace data and the second data.

A disclosed method includes executing a first program by a first processor. While the first processor continues to execute the first program, first trace data is transmitted from the first processor to a debug interface circuit, and the first trace data is transmitted from the debug interface circuit to a debug access port. The first trace data is provided to a fault detection circuit, and the fault detection circuit compares the first trace data to second data. The fault detection circuit generates an error signal to the first processor in response to a discrepancy between the first trace data and the second data.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

Figure 1:
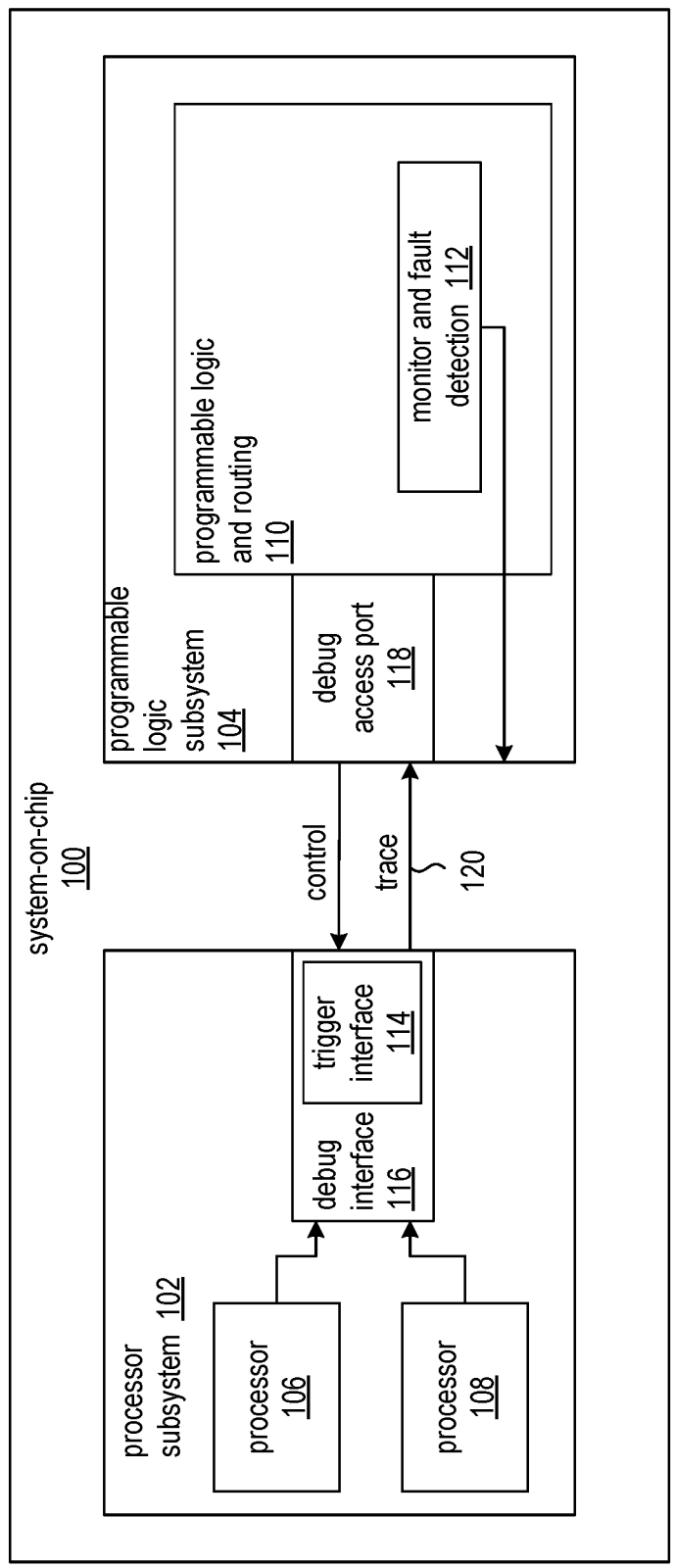
FIG. 1 shows a circuit diagram of an exemplary system-on-chip (SOC) having a debug interface that provides trace data from a processor subsystem to fault detection circuitry implemented in a programmable logic subsystem.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods provide non-intrusive monitoring of high-speed instruction processors by functional safety systems through use of embedded trace hardware. The embedded trace hardware, which is conventionally used for debugging software executing on one or more processors of the equipment under control (EUC), is used in the disclosed approaches in combination with monitoring circuitry deployed in a programmable logic subsystem to ensure integrity of the one or more processors while the system is operating in the intended application environment.

In an exemplary implementation, a system-on-chip includes a processor subsystem and a programmable logic subsystem. The processor subsystem includes at least one processor and a debug interface circuit. The debug interface circuit non-intrusively captures trace data output by the processor(s) and can be implemented by the built-in debug and trace hardware of the processor subsystem. The debug interface circuit continuously collects system information for real-time delivery and analysis by monitoring circuitry in the programmable logic subsystem.

The programmable logic subsystem includes programmable logic circuitry, programmable routing circuitry, and configuration memory. The programmable logic subsystem also includes a debug access port coupled to the programmable logic circuitry, the programmable routing circuitry, and the debug interface circuit. The configuration memory is programmed with configuration data that implement a fault detection circuit in the programmable logic circuitry and programmable routing circuitry. The fault detection circuit is configured to receive the trace data via the debug access port and to compare the trace data to another data set. In a system in which the trace data from a single processor is monitored, the other data set to which the trace data is compared can be a locally stored, static data set previously generated as expected results. Alternatively, the single processor can execute the same program code twice, and the trace data from each run can be compared. In a system in which the trace data from multiple processors is monitored, the fault detection circuit compares the trace data of each processor to the trace data of the other processor(s). In response to a discrepancy between the trace data and the other data, the fault detection circuit generates an error signal to the processor(s).

FIG. 1 shows a circuit diagram of an exemplary system-on-chip (SOC) 100 having a debug interface that provides trace data from a processor subsystem to fault detection circuitry implemented in a programmable logic subsystem. Though the disclosed approaches are described in the context of an SOC, those skilled in the art will recognize that the circuits and methods can be implemented in a system-in-package (SIP), a multi-chip module (MCM), or comparable arrangements of integrated circuits. The SOC 100 generally includes a processor subsystem 102 and a programmable logic subsystem 104. The processor subsystem and the programmable logic subsystem are in separate clock domains and can be connected by bus interface circuitry (not shown), such as an advanced extensible interface (AXI) bus.

The processor subsystem includes one or more processors 106 and 108. The processors can be CPUs, APUs, graphics processing units (GPUs), other similar processors, or combinations thereof. The processor subsystem further includes a built-in debug interface 116 that is connected to the processors for collecting trace data. The trace data can be a collection of information related to instruction execution and data transfers performed by the processors. The debug interface is configured to transmit trace data 120 to the debug access port 118 in the programmable logic subsystem. An exemplary built-in debug interface can be implemented by CORESIGHT™ technology from ARM Limited.

The debug interface 116 can include a trigger interface circuit 114. The trigger interface circuit can be a CoreSight-compatible component providing multiple trigger inputs from the debug interface and corresponding multiple trigger outputs to the programmable logic subsystem 104. For example, the trigger interface can include multiple 32-bit inputs (not shown) from the debug interface in the processor subsystem and multiple 32-bit outputs (not shown) to the debug access port 118 in the programmable logic subsystem. Triggers can be based on program sequence, data comparison, execution state change or a combination of these aspects.

The programmable logic subsystem 104 includes programmable logic circuitry, programmable routing circuitry, and configuration memory (not shown). The logic functions implemented in the programmable logic circuitry and the connections between the logic functions is defined by the state of the configuration memory.

The programmable logic subsystem 104 further includes a debug access port 118 and fault detection circuitry 112 implemented by the programmable logic and routing circuitry 110. The debug access port provides a data and control interface between the fault detection circuitry 112 in the programmable logic subsystem and the debug interface 116 in the processor subsystem 102. In an exemplary implementation, the debug access port follows the access model described in ARM Debug Interface v5 Architecture Specification and ARM Debug Interface v5.1 Architecture Supplement.

The fault detection circuitry 112, which is implemented in the programmable logic and routing circuitry 110, is configured to monitor the trace data 120 received from the processor(s) of the processor subsystem 102. Generally, the fault detection circuit receives the trace data via the debug access port and compares the trace data to another set of data. The source of the other set of data used for comparison is implementation dependent. The other data can be from a redundant processor executing in lockstep, the other data can be generated by the same processor in previously executing the same program code, or the other data can be expected data stored for purposes of monitoring correct operation of the processor. In response to a discrepancy between the trace data and the other data, the fault detection circuitry generates an error signal to the processor(s) in the processor subsystem.

Though the exemplary SOC 100 includes programmable logic, it will be recognized that the debug access port 118 and fault detection circuit 112 can be implemented in an application specific integrated circuit (ASIC). Thus, an alternative SOC can include the processor subsystem 102 and an ASIC module configured to implement the debug access port 118 and fault detection circuit 112.

Figure 2:
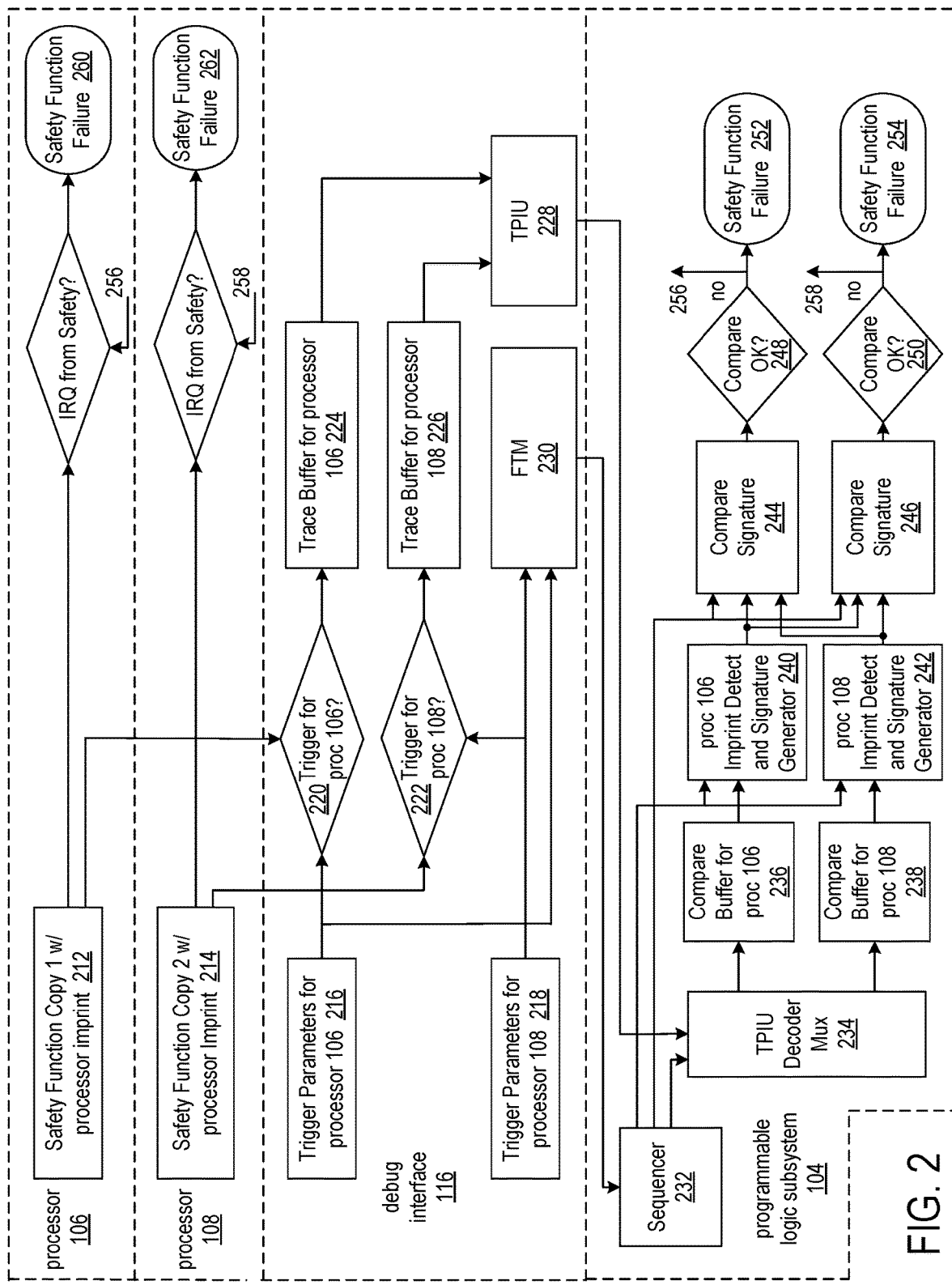
FIG. 2 is a flow diagram showing data and control flow amongst two processors in a processor subsystem, debug interface circuitry, and fault monitoring circuitry in the programmable logic subsystem.

FIG. 2 is a flow diagram showing data and control flow amongst two processors in a processor subsystem, debug interface circuitry, and fault monitoring circuitry in the programmable logic subsystem. In the exemplary flow, processor 106 executes a first copy of a safety function 212, and processor 108 executes a second copy of the safety function 214 in lockstep with execution by processor 106. The trace data output by the processors 106 and 108 is timestamped (or "imprinted") so that the trace data can be correlated and compared by the fault detection circuitry in the programmable logic subsystem 104.

The debug interface 116 can be configured with trigger parameters 216 associated with processor 106 and trigger parameters 218 associated with processor 108. Examples of trigger parameters can include program counter contents, register contents, CPU state flag contents, timestamps, etc. Trigger logic 220 monitors the state and output from processor 106 executing copy 1 of the safety function and compares the data to trigger parameters 216. Similarly, trigger logic 222 monitors the state and output from processor 108 executing copy 2 of the safety function and compares the data to trigger parameters 218. In response to the trace data from processor 106 satisfying the trigger parameters 216, the debug interface 116 stores the trace data from processor 106 in trace buffer 224. Similarly, in response to the trace data from processor 108 satisfying the trigger parameters 218, the debug interface 116 stores the trace data from processor 108 in trace buffer 226.

The fabric trigger macrocell (FTM) 230 signals the sequencer circuit 232 in the programmable logic subsystem 104 that a triggering event for capturing trace data has occurred. In an exemplary implementation, the FTM is a CoreSight-compatible component having multiple trigger inputs and trigger outputs and is used in the exemplary system to provide trigger signals to the sequencer circuit. The trigger parameter interface unit (TPIU) circuit 228 initiates transfer of the trace data from the trace buffers 224 and 226 to the TPIU decoder multiplexer 234 in the programmable logic subsystem.

The sequencer circuit 232 initiates requests via the debug access port 118 (FIG. 1) with requests on a bus. The TPIU 228 permits trace data from several sources to be merged into a single stream and later separated. Waypoints can be inserted to indicate the sources of the trace data and to indicate events, interrupts, or exceptions, for example. The TPIU 228 can output trace data in 16-byte frames. Each frame can consist of seven bytes of data and eight mixed-use bytes. Each byte of the mixed-use bytes contains one bit to indicate the use of the remaining seven bits, and the seven bits can be data or a change of trace source ID. Each frame further includes one byte of auxiliary bits, where each bit corresponds to one of the eight mixed-use bytes. If the corresponding byte is data, this bit indicates the remaining $8^{th}$ bit of that data. If the corresponding byte was an ID change, this bit indicates when that ID change takes effect. The sequencer circuit 232 can then select trace data output and trigger requests to the TPIU without loss of information. The programmable logic subsystem 104 supplies a clock signal to TPIU 228 using the same clock to sample the trace data and control signals provided by the debug interface 116 of the processor subsystem 102.

In the exemplary implementation compare buffers 236 and 238 are used for storage of trace data. The compare buffers can be operated in a static mode or a dynamic mode. In a static mode, a trigger event enables the buffer to capture trace data until the buffer is full or another trigger events stops the capture, at which time the contents of the compare buffer are ready to be compared with the contents of the other compare buffer.

In a dynamic mode, the buffer is a first-in-first-out (FIFO) buffer. A trigger event starts the capture of trace data and storage in the buffer. A later occurring second trigger stops the capture, and the contents of the buffer are ready to compare with the contents of the second buffer.

The contents of the compare buffer can also be used to verify the operation of the processor by direct examination. For example, the trace data can indicate a program address involving data values 3 and 6 and a result of 9. Because the trace data contains the operation address, data values, and result, the program address can be used to determine the operation and the result in the trace buffer can be checked by a tester circuit (not shown).

In implementations involving direct examination, requisite information can be provided by completing the design in two passes. The first pass builds the function in a high-level programmable language (e.g., C) with cross-references between the high-level language code and assembly/machine language code. The second pass finds by direct observation the addresses of interest that can be used as trigger points. Checker logic can verify operators but not the validity of the operands. The checker logic could verify boundary conditions by hard setting parameters or employing a learning mode by executing a specific training sequence. The checker logic could also be used to detect state machine errors by some searching for static boundary conditions on branch operands. The checker logic can detect stack overflow conditions by static boundary checking by looking at stack operators and initial addressing.

Sequencer circuit 232 also resolves different addressing between processors 106 and 108. Each of the processors can have a dedicated physical address space. In generating the signatures from the trace data, corresponding data needs to be used, and selecting the proper data from the compare buffers may require address translation. The debug interface marks the trace data with timestamps, and the sequencer circuit uses the timestamps to correlate the trace data from streams of trace data. The sequencer circuit 232 sets waypoints in the trace data. The waypoints indicate the beginning and ending of data sets to be compared.

The TPIU decoder multiplexer 234 receives from the sequencer circuit 232 data that identify the current captured data stream as being from processor 106 or processor 108. TPIU decoder multiplexer transfers the stream into the proper one of compare buffers 236 or 238 while controlling the data consistency such that the streams belonging to the processor 106 and processor 108 are properly aligned in time. The TPIU decoder multiplexer 234 follows the ARM TPIU protocol for decoding the incoming streams. The protocol is transaction based, and the TPIU decoder multiplexer 234 inserts a marker at every transaction to separate streams belonging to different trace data sets as demarcated by waypoints inserted by the sequencer circuit 232; the TPIU protocol interleaves data from different streams due to concurrency. The compare buffers 236 and 238 and imprint detection and signature generator circuits 240 and 242 use the markers inserted by the TPIU decoder multiplexer 234.

The imprint detection and signature generator circuits 240 and 242 read corresponding data sets from the compare buffers 236 and 238, respectively and generate respective signatures for comparisons. As the trace data in compare buffers 236 and 238 may not be fully aligned by base address, the imprint detection and signature generators search for matching waypoints in the compare buffers 236 and 238 and read corresponding data based on the markers and waypoints. The imprint detection and signature generators can reduce the amount of data to compare by generating signatures using a hash function, for example.

The fault detection circuitry in the programmable logic subsystem 104 includes redundant comparison paths. Comparison circuit 244 compares the signature provided from circuit 240 (signature trace from processor 106) to the signature provided from circuit 242 (signature trace from processor 108), and comparison circuit 246 compares the signature provided from circuit 242 (signature trace from processor 108) to the signature provided from circuit 240 (signature trace from processor 106).

The compare circuitry generates an error signal to processor 106 in response to a discrepancy between the signature trace from processor 106 and the signature trace from processor 108, as shown by decision block 248 and interrupt signal 256 to the processor 106. Similarly, The compare circuitry generates an error signal to processor 108 in response to a discrepancy between the signature trace from processor 108 and the signature trace from processor 106, as shown by decision block 250 and interrupt signal 258 to the processor 108. A discrepancy between compared signatures can be implicated by any difference between bits of the signatures. In response to a discrepancy, application-specific actions can be taken to address the failure of the safety function as shown by blocks 252, 254, 260, and 262. For example, the trace data and signatures can be logged, error alerts output for user information, and/or the system can be shutdown. If the signatures match, then no action is taken by the comparison circuitry, or a signal can be sent to the processor subsystem to indicate that operations can continue.

To protect against failure of the safety function, portions of the fault detection circuitry can be deployed is spatially separate regions of the programmable logic subsystem 104. For example, circuitry that implements the compare buffer 236, imprint detection and signature generation 240, comparison circuitry 244 and 248, and safety function failure 252 can be disposed in one region of the programmable logic subsystem; and the circuitry that implements the compare buffer 238, imprint detection and signature generation 242, comparison circuitry 246 and 250, and safety function failure 254 can be disposed in another region that does not overlap the first region. The sequencer circuit 232 and TPIU decoder multiplexer 234 can be deployed in yet another region that is separate from and does not overlap the aforementioned regions. Deploying the circuitry in non-overlapping regions can minimize errors resulting from common cause initiators such as single event upsets.

The monitor circuit in the programmable logic subsystem controls operation of the debug-and-trace circuit and evaluates data output by the debug-and-trace circuit to detect operational anomalies in the monitored processor(s). In response to detection of an anomaly, the monitor circuit can initiate application-specific actions to respond appropriately to the anomaly. For example, depending on the application and severity of the error, an alarm signal can be issued, the system can be rebooted, or the system can be shutdown. Additionally, the monitor circuit can provide a supervised positive response that a process was correctly executed.

Figure 3:
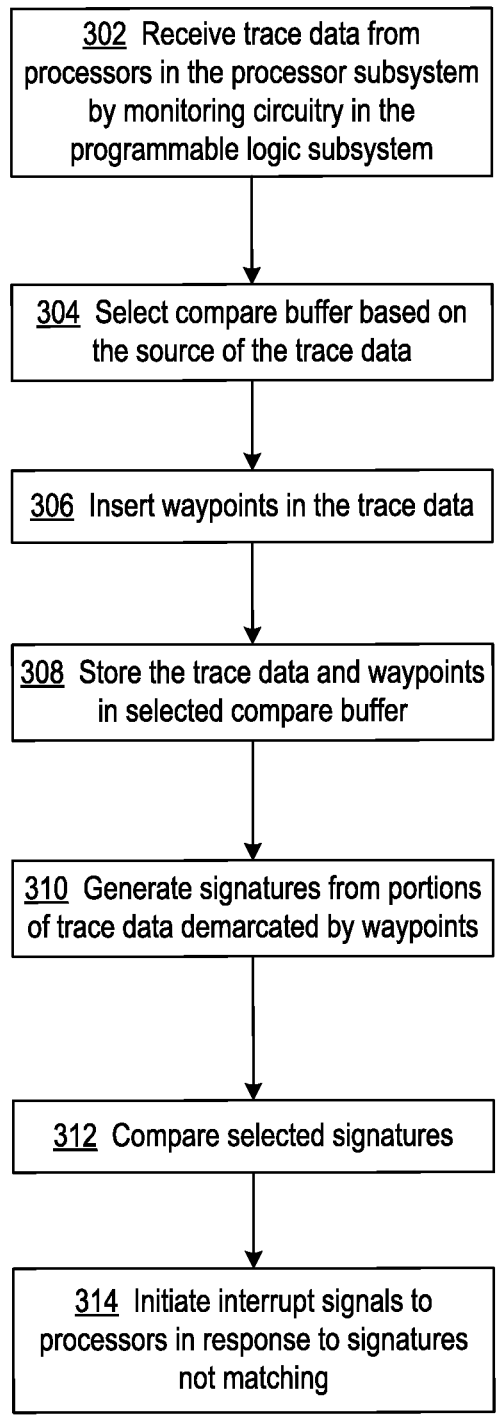
FIG. 3 shows a flowchart of an exemplary process for detecting failure of a safety function.

FIG. 3 shows a flowchart of an exemplary process for detecting failure of a safety function.

At block 302, fault detection circuitry, which is implemented in a programmable logic subsystem of an SOC, receives trace data from one or more processor cores that are implemented in a processing subsystem of an SOC.

At block 304, the fault detection circuitry selects a comparison buffer based on the source of the trace data. In an implementation having only a single processor, the selection of a comparison buffer can be avoided. The selection buffer can be adapted to compare execution runs from the same processor to detect transient faults.

However, in implementations having two or more processors, two or more comparison buffers can be deployed for storage of trace data from the two or more processors, respectively.

At block 306, waypoints are inserted in the trace data. The source of the trace data can provide timestamps with the trace data to help the fault detection circuitry in locating the appropriate trace data for comparison. The waypoints can be used to demarcate segments of trace data for comparison.

At block 308, the fault detection circuitry stores the trace data and waypoints in the selected compare buffer.

The fault detection circuitry at block 310 generates a signature from trace data demarcated by waypoints in the compare buffer. In implementations having multiple processors, the fault detection circuitry generates respective signatures from the trace data from the multiple processors.

At block 312, the fault detection circuitry compares the signatures to one another. In an implementation having a single processor that executes the same program code twice, the signature can be compared to a signature generated on the first iteration and stored for comparison. Alternatively, a single processor implementation can compare the signature to a static signature that is used to periodically check operations.

The fault detection circuitry initiates interrupt signals to the processors at block 314 in response to detecting a mismatch of the generated signatures.

Figure 4:
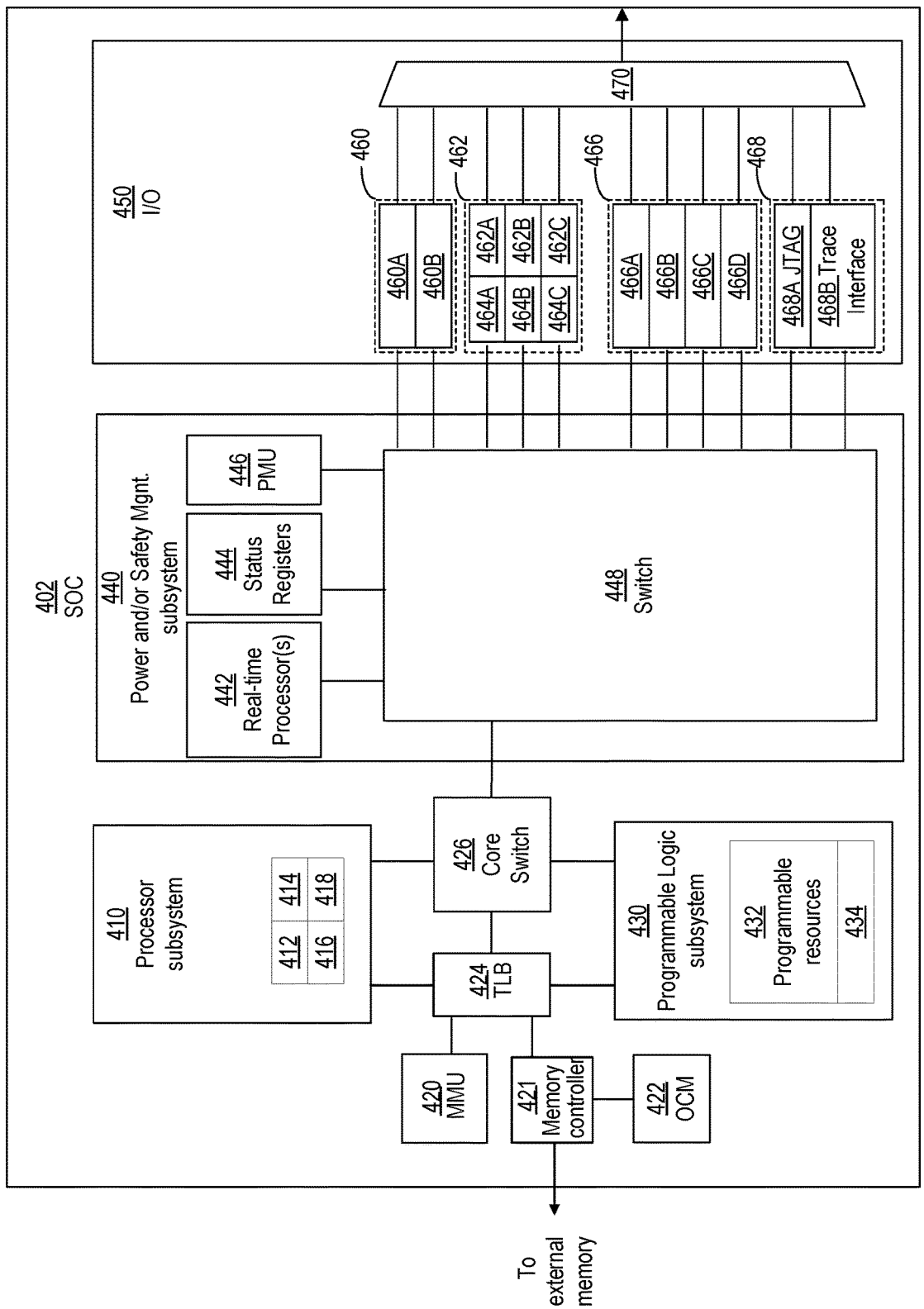
FIG. 4 shows an exemplary programmable IC that can be configured in accordance with the disclosed circuitry.

FIG. 4 shows an exemplary programmable IC 402 that can be configured in accordance with the disclosed circuitry. The programmable IC may also be referred to as a System On Chip (SOC), which includes a processor subsystem 410 and a programmable logic subsystem 430. Though the exemplary SOC includes programmable logic, it will be recognized that the disclosed methods and circuits can be implemented in an application specific integrated circuit. The processor subsystem 410 may be programmed to implement a software portion of the user design, via execution of a user program. The program may be specified as part of a configuration data stream or may be retrieved from an on-chip or off-chip data storage device. The processor subsystem 410 may include various circuits 412, 414, 416, and 418 for executing one or more software programs. The circuits 412, 414, 416, and 418 may include, for example, one or more processor cores, floating point units (FPUs), an interrupt processing unit, on chip-memory, memory caches, and/or cache coherent interconnect.

The programmable logic subsystem 430 of the programmable IC 402 may be programmed to implement a hardware portion of a user design. For instance, the programmable logic subsystem may include a number of programmable resources 432, which may be programmed to implement a set of circuits specified in a configuration data stream. The programmable resources 432 include, for example, programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 432 may be programmed by loading a configuration data stream into the configuration memory cells, which define how the programmable interconnect circuits and programmable logic circuits are configured. For example, setting a configuration memory cell for a configurable latch to a first value may direct the configurable latch to operate as a single-edge-driven latch. Setting the configuration memory cell to a second value may direct the configurable latch to operate as a double-edge-driven latch. The collective states of the individual memory cells then determine the function of the programmable resources 432. The configuration data can be read from memory (e.g., from an external PROM) or written into the programmable IC 402 by an external device. In some implementations, a configuration controller 434 included in the programmable logic subsystem 430 may program the programmable resources, in response to powering on the programmable IC, by retrieving configuration data from a non-volatile memory coupled to the programmable IC and loading the configuration data into the configuration memory cells. In some other implementations, the configuration data may be loaded into the configuration memory cells by a start-up process executed by the processor subsystem 410.

The programmable IC 402 may include various circuits to interconnect the processor subsystem 410 with circuitry implemented within the programmable logic subsystem 430. In this example, the programmable IC 402 includes a core switch 426 that can route data signals between various data ports of the processor subsystem 410 and the programmable logic subsystem 430. The core switch 426 may also route data signals between either of the programmable logic or processing subsystems 410 and 430 and various other circuits of the programmable IC, such as an internal data bus. Alternatively or additionally, the processor subsystem 410 may include an interface to directly connect with the programmable logic subsystem—bypassing the core switch 426. Such an interface may be implemented, for example, using the AMBA AXI Protocol Specification (AXI) as published by ARM.

In some implementations, the processor subsystem 410 and the programmable logic subsystem 430 may also read or write to memory locations of an on-chip memory (OCM) 422 or off-chip memory (not shown) via memory controller 421. The memory controller 421 can be implemented to communicate with one or more different types of memory circuits including, but not limited to, Double Data Rate (DDR) 2, DDR3, and DDR4 types of memory, whether 16-bit, 32-bit, 16-bit with ECC, etc. The list of different memory types with which memory controller 421 is able to communicate is provided for purposes of illustration only and is not intended as a limitation or to be exhaustive. As shown in FIG. 4, the programmable IC 402 may include a memory management unit (MMU) 420 and translation lookaside buffer (TLB) 424 to translate virtual memory addresses used by the subsystems 410 and 430 to physical memory addresses used by the memory controller 421 to access specific memory locations.

The programmable IC may include an input/output (I/O) subsystem 450 for communication of data with external circuits. The I/O subsystem 450 may include various types of I/O devices or interfaces including for example, flash memory type I/O devices, higher performance I/O devices, lower performance interfaces, debugging I/O devices, and/or RAM I/O devices.

The I/O subsystem 450 may include one or more flash memory interfaces 460 illustrated as 460A and 460B. For example, one or more of flash memory interfaces 460 can be implemented as a Quad-Serial Peripheral Interface (QSPI) configured for 4-bit communication. One or more of flash memory interfaces 460 can be implemented as a parallel 8-bit NOR/SRAM type of interface. One or more of flash memory interfaces 460 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 450 can include one or more interfaces 462 providing a higher level of performance than flash memory interfaces 460. Each of interfaces 462A-462C can be coupled to a DMA controller 464A-464C respectively. For example, one or more of interfaces 462 can be implemented as a Universal Serial Bus (USB) type of interface. One or more of interfaces 462 can be implemented as a gigabit Ethernet type of interface. One or more of interfaces 462 can be implemented as a Secure Digital (SD) type of interface.

The I/O subsystem 450 may also include one or more interfaces 466 such as interfaces 466A-466D that provide a lower level of performance than interfaces 462. For example, one or more of interfaces 466 can be implemented as a General Purpose I/O (GPIO) type of interface. One or more of interfaces 466 can be implemented as a Universal Asynchronous Receiver/Transmitter (UART) type of interface. One or more of interfaces 466 can be implemented in the form of a Serial Peripheral Interface (SPI) bus type of interface. One or more of interfaces 466 can be implemented in the form of a Controller-Area-Network (CAN) type of interface and/or an inter-integrated circuit ($I^2C$) type of interface. One or more of interfaces 466 also can be implemented in the form of a timer type of interface.

The I/O subsystem 450 can include one or more debug interfaces 468 such as processor JTAG (PJTAG) interface 468A and a trace interface 468B. PJTAG interface 468A can provide an external debug interface for the programmable IC 402. Trace interface 468B can provide a port to receive debug, e.g., trace, information from the processor subsystem 410 or the programmable logic subsystem 430.

As shown, each of interfaces 460, 462, 466, and 468 can be coupled to a multiplexer 470. Multiplexer 470 provides a plurality of outputs that can be directly routed or coupled to external pins of the programmable IC 402, e.g., balls of the package within which the programmable IC 402 is disposed. For example, I/O pins of programmable IC 402 can be shared among interfaces 460, 462, 466, and 468. A user can configure multiplexer 470, via a configuration data stream to select which of interfaces 460-468 are to be used and, therefore, coupled to I/O pins of programmable IC 402 via multiplexer 470. The I/O subsystem 450, may also include a fabric multiplexer I/O (FMIO) interface (not shown) to connect interfaces 460-468 to programmable logic circuits of the programmable logic subsystem. Additionally or alternatively, the programmable logic subsystem 430 can be configured to implement one or more I/O circuits within programmable logic. In some implementations, the programmable IC 402 may also include a subsystem 440 having various circuits for power and/or safety management. For example, the subsystem 440 may include a power management unit (PMU) 446 configured to monitor and maintain one or more voltage domains used to power the various subsystems of the programmable IC 402. In some implementations, the power management unit 446 may disable power of individual subsystems, when idle, to reduce power consumption, without disabling power to subsystems in use.

The subsystem 440 may also include safety circuits to monitor the status of the subsystems to ensure correct operation. For instance, the subsystem 440 may include one or more real-time processors 442 configured to monitor the status of the various subsystems (e.g., as indicated in status registers 444). The real-time processors 442 may be configured to perform a number of tasks in response to detecting errors. For example, for some errors, the real-time processors 442 may generate an alert in response to detecting an error. As another example, the real-time processors 442 may reset a subsystem to attempt to restore the subsystem to correct operation. The subsystem 440 includes a switch network 448 that may be used to interconnect various subsystems. For example, the switch network 448 may be configured to connect the various subsystems 410, 430, and 440 to various interfaces of the I/O subsystem 450. In some applications, the switch network 448 may also be used to isolate the real-time processors 442 from the subsystems that are to be monitored. Such isolation may be required by certain application standards (e.g., IEC-61508 SIL3 or ISO-26262 standards) to ensure that the real-time processors 442 are not affected by errors that occur in other subsystems.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for safety systems. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement, comprising:
a first processor;
a second processor;
a debug interface circuit coupled to the first processor and to the second processor, and configured to transmit first trace data from the first processor and second trace data from the second processor;
a debug access port coupled to the debug interface circuit; and
a fault detection circuit coupled to the debug access port and configured to receive the first trace data and the second trace data via the debug access port, the fault detection circuit including:
first compare circuitry configured to compare the first trace data to the second trace data, wherein the first compare circuitry is configured to generate the error signal to the first processor in response to a discrepancy between the first trace data and the second trace data; and
second compare circuitry configured to compare the second trace data to the first trace data, wherein the second compare circuitry is configured to generate another error signal to the second processor in response to a discrepancy between the second trace data and the first trace data.

2. The circuit arrangement of claim 1, wherein the first compare circuitry and the second compare circuitry are implemented in non-overlapping regions of an integrated circuit die.

3. The circuit arrangement of claim 1, further comprising:
a first buffer circuit coupled to receive and configured to store the first trace data;
a second buffer circuit coupled to receive and configured to store the second trace data; and
a sequencer circuit coupled to the first and second buffer circuits, wherein the sequencer circuit is configured to insert a first waypoint in the first trace data and a second waypoint in the second trace data; and
wherein the first compare circuitry is configured to compare a subset of the first trace data terminated by the first waypoint to a subset of the second trace data terminated by the second waypoint.

4. The circuit arrangement of claim 3, further comprising:
a first signature generator circuit coupled to the first buffer circuit and configured to generate a first signature from the first trace data; and
a second signature generator circuit coupled to the second buffer circuit and configured to generate a second signature from the second trace data;
wherein the first compare circuitry is configured to compare the first signature to the second signature, and the second compare circuitry is configured to compare the second signature to the first signature.

5. A circuit arrangement, comprising:
a processor subsystem including:
a first processor;
a second processor; and
a debug interface circuit coupled to the first processor and to the second processor, and configured to transmit first trace data from the first processor and second trace data from the second processor; and
a programmable logic subsystem including:
programmable logic circuitry;
programmable routing circuitry coupled to the programmable logic circuitry;
a debug access port coupled to the programmable logic circuitry, to the programmable routing circuitry, and to the debug interface circuit; and
configuration memory programmed with configuration data that implement a fault detection circuit in the programmable logic circuitry and programmable routing circuitry, wherein the fault detection circuit is configured to receive the first trace data via the debug access port, the fault detection circuit including:
first compare circuitry configured to compare the first trace data to the second trace data, wherein the first compare circuitry is configured to generate the error signal to the first processor in response to a discrepancy between the first trace data and the second trace data; and
second compare circuitry configured to compare the second trace data to the first trace data, wherein the second compare circuitry is configured to generate another error signal to the second processor in response to a discrepancy between the second trace data and the first trace data.

6. The circuit arrangement of claim 5, wherein the first compare circuitry and the second compare circuitry are implemented in non-overlapping regions of the programmable logic subsystem.

7. The circuit arrangement of claim 5, further comprising:
a first buffer circuit coupled to receive and configured to store the first trace data;
a second buffer circuit coupled to receive and configured to store the second trace data; and
a sequencer circuit coupled to the first and second buffer circuits, wherein the sequencer circuit is configured to insert a first waypoint in the first trace data and a second waypoint in the second trace data;
wherein the first compare circuitry is configured to compare a subset of the first trace data terminated by the first waypoint to a subset of the second trace data terminated by the second waypoint.

8. The circuit arrangement of claim 7, further comprising:
a first signature generator circuit coupled to the first buffer circuit and configured to generate a first signature from the first trace data; and
a second signature generator circuit coupled to the second buffer circuit and configured to generate a second signature from the second trace data;
wherein the first compare circuitry is configured to compare the first signature to the second signature, and the second compare circuitry is configured to compare the second signature to the first signature.

9. A method, comprising:
executing a first program by a first processor;
executing a second program by a second processor; and
while the first processor continues to execute the first program and the second processor continues to execute the second program:

transmitting first trace data from the first processor and second trace data from the second processor to a debug interface circuit, transmitting the first trace data and the second trace data from the debug interface circuit to a debug access port, providing the first trace data and the second trace data to a fault detection circuit, comparing the first trace data to second trace data by first compare circuitry of the fault detection circuit, comparing the second trace data to the first trace data by second compare circuitry of the fault detection circuit, generating a first error signal to the first processor in response to a discrepancy between the first trace data and the second data, and generating a second error signal to the second processor in response to a discrepancy between the second trace data and the first trace data.

10. The method of claim 9, further comprising:

storing the first trace data in a first buffer circuit;

storing the second trace data in a second buffer circuit;

inserting a first waypoint in the first trace data and a second waypoint in the second trace data; and comparing a subset of the first trace data terminated by the first waypoint to a subset of the second trace data terminated by the second waypoint.

11. The method of claim 9, wherein the comparing includes determining, from an operation referencing a program address in the first trace data and result data specified in the first trace data, whether the result data is correct.

\* \* \* \* \*